(12) United States Patent
Gimenez et al.

(10) Patent No.: US 11,575,363 B2
(45) Date of Patent: Feb. 7, 2023

(54) HYBRID BULK ACOUSTIC WAVE FILTER

(71) Applicant: Qorvo US, Inc., Greensboro, NC (US)

(72) Inventors: Alfred Gimenez, Altamonte Springs, FL (US); Wolfgang Heeren, Eustis, FL (US); Gernot Fattinger, Sorrento, FL (US); Mudar Al-Joumayly, Casselberry, FL (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 17/152,110

(22) Filed: Jan. 19, 2021

(65) Prior Publication Data

US 2022/0231664 A1  Jul. 21, 2022

(51) Int. Cl.
*H03H 9/56* (2006.01)
*H03H 9/02* (2006.01)
*H03H 9/00* (2006.01)
*H03H 9/17* (2006.01)
(Continued)

(52) U.S. Cl.
CPC .......... *H03H 9/568* (2013.01); *H03H 9/0014* (2013.01); *H03H 9/02031* (2013.01); *H03H 9/173* (2013.01); *H03H 9/174* (2013.01); *H03H 9/176* (2013.01); *H03H 9/542* (2013.01); *H03H 9/562* (2013.01); *H03H 9/564* (2013.01); *H03H 9/703* (2013.01)

(58) Field of Classification Search
CPC .. H03H 9/562; H03H 9/0014; H03H 9/02031; H03H 9/173; H03H 9/174; H03H 9/176; H03H 9/542; H03H 9/564; H03H 9/568; H03H 9/703

USPC .......................................... 333/133, 187, 188
See application file for complete search history.

(56) References Cited

U.S. PATENT DOCUMENTS

| 3,731,230 A | 5/1973 | Cerny, Jr. |
| 3,875,533 A | 4/1975 | Irwin et al. |
| 4,442,434 A | 4/1984 | Baekgaard |

(Continued)

FOREIGN PATENT DOCUMENTS

| CN | 111917392 A | 11/2020 |
| JP | 2002251190 A | 9/2002 |

(Continued)

OTHER PUBLICATIONS

Notice of Allowance for U.S. Appl. No. 16/290,175, dated Jun. 14, 2021, 7 pages.

(Continued)

*Primary Examiner* — Samuel S Outten
*Assistant Examiner* — Jorge L Salazar, Jr.
(74) *Attorney, Agent, or Firm* — Withrow & Terranova, P.L.L.C.

(57) ABSTRACT

RF filtering circuitry comprises a first node, a second node, and a series signal path between the first node and the second node. A number of acoustic resonators are coupled to one or more of the first node and the second node via the series signal path. A first one of the acoustic resonators is associated with a first quality factor and a first electromechanical coupling coefficient. A second one of the acoustic resonators is associated with a second quality factor and a second electromechanical coupling coefficient. The first quality factor is different from the second quality factor and the first electromechanical coupling coefficient is different from the second electromechanical coupling coefficient.

20 Claims, 8 Drawing Sheets

(51) Int. Cl.
 *H03H 9/54* (2006.01)
 *H03H 9/70* (2006.01)

(56) References Cited

U.S. PATENT DOCUMENTS

| | | |
|---|---|---|
| 4,577,168 A | 3/1986 | Hartmann |
| 5,291,159 A | 3/1994 | Vale |
| 5,821,833 A | 10/1998 | Lakin |
| 6,067,391 A | 5/2000 | Land |
| 6,246,153 B1 | 6/2001 | Bishop et al. |
| 6,670,866 B2 | 12/2003 | Ellaet et al. |
| 6,671,016 B1 | 12/2003 | Kim |
| 6,714,099 B2 | 3/2004 | Hikita et al. |
| 6,720,844 B1 | 4/2004 | Lakin |
| 6,927,649 B2 | 8/2005 | Metzger et al. |
| 6,927,651 B2 | 8/2005 | Larson, III et al. |
| 6,975,183 B2 | 12/2005 | Aigner et al. |
| 7,057,478 B2 | 6/2006 | Korden et al. |
| 7,173,504 B2 | 2/2007 | Larson, III et al. |
| 7,239,067 B2 | 7/2007 | Komuro et al. |
| 7,321,183 B2 | 1/2008 | Ebuchi et al. |
| 7,333,831 B2 | 2/2008 | Srinivasan et al. |
| 7,342,351 B2 | 3/2008 | Kubo et al. |
| 7,367,095 B2 | 5/2008 | Larson, III et al. |
| 7,391,285 B2 | 6/2008 | Larson, III et al. |
| 7,436,269 B2 | 10/2008 | Wang et al. |
| 7,459,990 B2 | 12/2008 | Wunnicke et al. |
| 7,515,018 B2 | 4/2009 | Handtmann et al. |
| 7,804,374 B1 | 9/2010 | Brown et al. |
| 7,825,749 B2 | 11/2010 | Thalhammer et al. |
| 7,855,618 B2 | 12/2010 | Frank et al. |
| 7,889,024 B2 | 2/2011 | Bradley et al. |
| 7,898,493 B1 | 3/2011 | Rojas et al. |
| 7,956,705 B2 | 6/2011 | Meister et al. |
| 7,973,620 B2 | 7/2011 | Shirakawa et al. |
| 8,026,776 B2 | 9/2011 | Ueda et al. |
| 8,248,185 B2 | 8/2012 | Choy et al. |
| 8,508,315 B2 | 8/2013 | Jamneala et al. |
| 8,575,820 B2 | 11/2013 | Shirakawa et al. |
| 8,576,024 B2 | 11/2013 | Erb et al. |
| 8,923,794 B2 | 12/2014 | Aigner |
| 8,981,627 B2 | 3/2015 | Sakuma et al. |
| 8,991,022 B2 | 3/2015 | Satoh et al. |
| 9,054,671 B2 | 6/2015 | Adkisson et al. |
| 9,054,674 B2 | 6/2015 | Inoue et al. |
| 9,197,189 B2 | 11/2015 | Miyake |
| 9,243,316 B2 | 1/2016 | Larson, III et al. |
| 9,484,883 B2 | 11/2016 | Nishizawa et al. |
| 9,698,756 B2 | 7/2017 | Khlat et al. |
| 9,837,984 B2 | 12/2017 | Khlat et al. |
| 9,847,769 B2 | 12/2017 | Khlat et al. |
| 9,887,686 B2 | 2/2018 | Kuwahara |
| 9,929,716 B2 | 3/2018 | Lee et al. |
| 9,985,605 B2 | 5/2018 | Tani et al. |
| 10,009,001 B2 | 6/2018 | Jiang et al. |
| 10,141,644 B2 | 11/2018 | Khlat et al. |
| 10,284,174 B2 | 5/2019 | Khlat et al. |
| 2002/0109564 A1 | 8/2002 | Tsai et al. |
| 2004/0100342 A1 | 5/2004 | Nishihara et al. |
| 2004/0263286 A1 | 12/2004 | Unterberger |
| 2005/0057117 A1 | 3/2005 | Nakatsuka et al. |
| 2005/0093648 A1 | 5/2005 | Inoue |
| 2005/0206476 A1 | 9/2005 | Ella et al. |
| 2006/0091978 A1 | 5/2006 | Wang et al. |
| 2008/0007369 A1 | 1/2008 | Barber et al. |
| 2008/0055020 A1 | 3/2008 | Handtmann et al. |
| 2008/0169884 A1 | 7/2008 | Matsumoto et al. |
| 2008/0272853 A1 | 11/2008 | Heinze et al. |
| 2008/0297278 A1 | 12/2008 | Handtmann et al. |
| 2009/0096549 A1 | 4/2009 | Thalhammer et al. |
| 2009/0096550 A1 | 4/2009 | Handtmann et al. |
| 2009/0273415 A1 | 11/2009 | Frank et al. |
| 2010/0277237 A1 | 11/2010 | Sinha et al. |
| 2011/0115334 A1 | 5/2011 | Konishi et al. |
| 2011/0121689 A1 | 5/2011 | Grannen et al. |
| 2011/0204995 A1 | 8/2011 | Jamneala et al. |
| 2011/0210787 A1 | 9/2011 | Lee et al. |
| 2012/0007696 A1 | 1/2012 | Pang et al. |
| 2012/0187799 A1 | 7/2012 | Nakahashi |
| 2012/0313725 A1 | 12/2012 | Ueda et al. |
| 2013/0033150 A1 | 2/2013 | Bardong et al. |
| 2013/0113576 A1 | 5/2013 | Inoue et al. |
| 2013/0193808 A1 | 8/2013 | Feng et al. |
| 2014/0085020 A1 | 3/2014 | Reinhardt et al. |
| 2014/0125203 A1 | 5/2014 | Choy et al. |
| 2014/0132117 A1 | 5/2014 | Larson, III |
| 2014/0145557 A1 | 5/2014 | Tanaka |
| 2014/0167565 A1 | 6/2014 | Iwamoto |
| 2015/0054387 A1 | 2/2015 | Li |
| 2015/0222246 A1 | 8/2015 | Nosaka |
| 2015/0280100 A1 | 10/2015 | Burak et al. |
| 2015/0369153 A1 | 12/2015 | Tsunooka et al. |
| 2016/0028364 A1 | 1/2016 | Takeuchi |
| 2016/0056789 A1 | 2/2016 | Otsubo et al. |
| 2016/0191012 A1 | 6/2016 | Khlat et al. |
| 2016/0191014 A1 | 6/2016 | Khlat et al. |
| 2016/0191016 A1 | 6/2016 | Khlat et al. |
| 2016/0261235 A1 | 9/2016 | Ortiz |
| 2016/0268998 A1 | 9/2016 | Xu et al. |
| 2016/0308576 A1 | 10/2016 | Khlat et al. |
| 2016/0359468 A1 | 12/2016 | Taniguchi et al. |
| 2017/0093369 A1 | 3/2017 | Khlat et al. |
| 2017/0093370 A1 | 3/2017 | Khlat et al. |
| 2017/0141757 A1 | 5/2017 | Schmidhammer |
| 2017/0201233 A1 | 7/2017 | Khlat |
| 2017/0301992 A1 | 10/2017 | Khlat et al. |
| 2017/0310302 A1 | 10/2017 | Bauder et al. |
| 2017/0324159 A1 | 11/2017 | Khlat |
| 2017/0338795 A1 | 11/2017 | Nakagawa et al. |
| 2018/0013402 A1 | 1/2018 | Kirkpatrick et al. |
| 2018/0019731 A1 | 1/2018 | Tsukamoto et al. |
| 2018/0041191 A1 | 2/2018 | Park |
| 2018/0076793 A1 | 3/2018 | Khlat et al. |
| 2018/0076794 A1 | 3/2018 | Khlat et al. |
| 2018/0109236 A1 | 4/2018 | Konoma |
| 2018/0109237 A1 | 4/2018 | Wasilik et al. |
| 2018/0145658 A1 | 5/2018 | Saji |
| 2018/0219530 A1 | 8/2018 | Khlat et al. |
| 2018/0241418 A1 | 8/2018 | Takamine et al. |
| 2018/0358947 A1 | 12/2018 | Mateu et al. |
| 2019/0103851 A1 | 4/2019 | Yusuf |
| 2019/0140618 A1 | 5/2019 | Takamine |
| 2019/0181824 A1 | 6/2019 | Timme et al. |
| 2019/0181835 A1 | 6/2019 | Timme et al. |
| 2019/0199320 A1 | 6/2019 | Morita et al. |
| 2019/0207583 A1 | 7/2019 | Miura et al. |
| 2019/0222197 A1 | 9/2019 | Saji |
| 2019/0288664 A1 | 9/2019 | Saji |
| 2019/0305752 A1 | 10/2019 | Sadhu et al. |
| 2020/0099360 A1 | 3/2020 | Khlat |
| 2020/0099362 A1 | 3/2020 | Khlat |
| 2020/0099363 A1 | 3/2020 | Khlat |
| 2020/0099364 A1 | 3/2020 | Khlat |
| 2020/0136589 A1 | 4/2020 | Khlat |
| 2021/0028755 A1 | 1/2021 | Yusuf |
| 2022/0069800 A1* | 3/2022 | Han ............... H03H 9/174 |

FOREIGN PATENT DOCUMENTS

| | | |
|---|---|---|
| JP | 2008085989 A | 4/2008 |
| JP | 2011176744 A | 9/2011 |
| JP | 2012257050 A | 12/2012 |
| JP | 2017103654 A | 6/2017 |
| JP | 2018093388 A | 6/2018 |

OTHER PUBLICATIONS

Corrected Notice of Allowability for U.S. Appl. No. 16/290,175, dated Jun. 23, 2021, 4 pages.

Notice of Allowance for U.S. Appl. No. 16/740,667, dated Jun. 11, 2021, 7 pages.

Notice of Allowance for U.S. Appl. No. 16/776,738, dated Jun. 11, 2021, 7 pages.

(56) References Cited

OTHER PUBLICATIONS

Notice of Allowance for U.S. Appl. No. 16/806,166, dated Jun. 18, 2021, 7 pages.
Non-Final Office Action for U.S. Appl. No. 14/757,587, dated Sep. 13, 2016, 12 pages.
Notice of Allowance for U.S. Appl. No. 14/757,587, dated Mar. 9, 2017, 8 pages.
Non-Final Office Action for U.S. Appl. No. 15/004,084, dated Jun. 12, 2017, 9 pages.
Non-Final Office Action for U.S. Appl. No. 14/757,651, dated Jun. 9, 2017, 11 pages.
Non-Final Office Action for U.S. Appl. No. 15/275,957, dated Jun. 14, 2017, 9 pages.
Ex Parte Quayle Action for U.S. Appl. No. 15/347,452, dated Jun. 15, 2017, 7 pages.
Final Office Action for U.S. Appl. No. 15/275,957, dated Jan. 2, 2018, 7 pages.
Author Unknown, "SAW Filters—SAW Resonators: Surface Acoustic Wave SAW Components," Product Specification, 2010, Token Electronics Industry Co., Ltd., 37 pages.
Fattinger, Gernot et al., "Miniaturization of BAW Devices and the Impact of Wafer Level Packaging Technology," Joint UFFC, EFTF and PFM Symposium, Jul. 21-25, 2013, Prague, Czech Republic, IEEE, pp. 228-231.
Kwa, Tom, "Wafer-Level Packaged Accelerometer With Solderable SMT Terminals," IEEE Sensors, Oct. 22-25, 2006, Daegu, South Korea, IEEE, pp. 1361-1364.
Lakin, K. M., "Coupled Resonator Filters," 2002 IEEE Ultrasonics Symposium, Oct. 8-11, 2002, Munich, Germany, 8 pages.
López, Edén Corrales, "Analysis and Design of Bulk Acoustic Wave Filters Based on Acoustically Coupled Resonators," PhD Thesis, Department of Telecommunications and Systems Engineering, Autonomous University of Barcelona, May 2011, 202 pages.
Potter, Bob R. et al., "Embedded Inductors Incorporated in the Design of SAW Module SMT Packaging," Proceedings of the 2002 Ultrasonics Symposium, Oct. 8-11, 2002, IEEE, pp. 397-400.
Schneider, Robert, "High-Q AlN Contour Mode Resonators with Unattached, Voltage-Actuated Electrodes," Thesis, Technical Report No. UCB/EECS-2015-247, Dec. 17, 2015, Electrical Engineering and Computer Sciences, University of California at Berkeley, http://www.eecs.berkeley.edu/Pubs/TechRpts/2015/EECS-2015-247.html, Robert Anthony Schneider, 222 pages.
Shirakawa, A. A., et al., "Bulk Acoustic Wave-Coupled Resonator Filters: Concept, Design, and Application," International Journal of RF and Microwave Computer-Aided Engineering, vol. 21, No. 5, Sep. 2011, 9 pages.
Dorrales, Eden, et al., "Design of Three-Pole Bulk Acoustic Wave Coupled Resonator Filters," 38th European Microwave Conference, Oct. 2008, Amsterdam, Netherlands, EuMA, pp. 357-360.
De Paco, Pedro, et al., "Equivalent Circuit Modeling of Coupled Resonator Filters," Transactions on Ultrasonics, Ferroelectrics, and Frequency Control, vol. 55, Issue 9, Sep. 2008, IEEE, pp. 2030-2037.
Lakin, K. M., "Bulk Acoustic Wave Coupled Resonator Filters," International Frequency Control Symposium, 2002, IEEE, pp. 8-14.
Shirakawa, A. A., et al., "Bulk Acoustic Wave Coupled Resonator Filters Synthesis Methodology," European Microwave Conference, Oct. 4-6, 2005, Paris, France, IEEE, 4 pages.
Tosic, Dejan, et al., "Symbolic analysis of immitance inverters," 14th Telecommunications Forum, Nov. 21-23, 2006, Belgrade, Serbia, pp. 584-487.
Non-Final Office Action for U.S. Appl. No. 14/757,651, dated May 8, 2018, 8 pages.
Notice of Allowance for U.S. Appl. No. 15/347,428, dated Jul. 12, 2018, 9 pages.
Notice of Allowance for U.S. Appl. No. 15/490,381, dated May 23, 2018, 8 pages.
Final Office Action for U.S. Appl. No. 14/757,651, dated Sep. 19, 2018, 7 pages.
Non-Final Office Action for U.S. Appl. No. 15/701,759, dated Oct. 4, 2018, 10 pages.
Notice of Allowance for U.S. Appl. No. 15/727,117, dated Mar. 13, 2019, 9 pages.
Non-Final Office Action for U.S. Appl. No. 15/586,374, dated Feb. 26, 2019, 16 pages.
Notice of Allowance for U.S. Appl. No. 15/720,706, dated Mar. 15, 2019, 9 pages.
Non-Final Office Action for U.S. Appl. No. 15/697,658, dated May 1, 2019, 13 pages.
Larson, John, et al., "Characterization of Reversed c-axis AlN Thin Films," International Ultrasonics Symposium Proceedings, 2010, IEEE, pp. 1054-1059.
Notice of Allowance for U.S. Appl. No. 15/586,374, dated Oct. 4, 2019, 7 pages.
Notice of Allowance for U.S. Appl. No. 15/644,922, dated Oct. 21, 2019, 10 pages.
Final Office Action for U.S. Appl. No. 15/697,658, dated Oct. 22, 2019, 9 pages.
Non-Final Office Action for U.S. Appl. No. 15/883,933, dated Oct. 25, 2019, 19 pages.
Non-Final Office Action for U.S. Appl. No. 16/003,417, dated Apr. 3, 2020, 9 pages.
Capilla, Jose et al., "High-Acoustic-Impedence Tantalum Oxide Layers for Insulating Acoustic Reflectors," IEEE Transactions on Ultrasonics, Ferroelectrics, and Frequency Control, vol. 59, No. 3, Mar. 2012, IEEE, pp. 366-372.
Fattinger, Gernot et al., "Single-to-balanced Filters for Mobile Phones using Coupled Resonator BAW Technology," 2004 IEEE International Ultrasonics, Ferroelectrics,and Frequency Control Joint 50th Anniversary Conference, Aug. 23-27, 2004, IEEE, pp. 416-419.
Lakin, K. M. et al., "High Performance Stacked Crystal Filters for GPS and Wide Bandwidth Applications," 2001 IEEE Ultrasonics Symposium, Oct. 7-10, 2001, IEEE, pp. 833-838.
Roy, Ambarish et al., "Spurious Modes Suppression in Stacked Crystal Filter," 2010 IEEE Long Island Systems, Applications and Technology Conference, May 7, 2010, 6 pages.
Non-Final Office Action for U.S. Appl. No. 16/290,175, dated Apr. 14, 2020, 29 pages.
Ibrahim, A. et al., "Compact Size Microstrip Coupled Resonator Band Pass Filter Loaded with Lumped Capacitors," 2013 Second International Japan-Egypt Conference on Electronics, Communications and Computers (JEC-ECC), Dec. 17-19, 2013, Egypt, IEEE, 4 pages.
Tsai, H. et al., "Tunable Filter by FBAR Using Coupling Capacitors," Proceedings of the 2018 Asia-Pacific Microwave Conference (APMC), Nov. 6-9, 2018, Kyoto, Japan, IEICE, pp. 609-611.
Zhu, L. et al., "Adjustable Bandwidth Filter Design Based on Interdigital Capacitors," IEEE Microwave and Wireless Components Letters, vol. 18, No. 1, Jan. 2008, IEEE, pp. 16-18.
Non-Final Office Action for U.S. Appl. No. 16/283,044, dated Nov. 12, 2020, 9 pages.
Notice of Allowance for U.S. Appl. No. 15/697,658, dated Nov. 17, 2020, 7 pages.
Final Office Action for U.S. Appl. No. 15/883,933, dated Oct. 23, 2020, 15 pages.
Advisory Action for U.S. Appl. No. 15/883,933, dated Dec. 31, 2020, 3 pages.
Notice of Allowance and Examiner-Initiated Interview Summary for U.S. Appl. No. 16/003,417, dated Aug. 5, 2020, 9 pages.
Final Office Action for U.S. Appl. No. 16/290,175, dated Sep. 17, 2020, 13 pages.
Non-Final Office Action for U.S. Appl. No. 16/290,175, dated Jan. 6, 2021, 14 pages.
Aigner, R. et al., "3G-4G-5G: How BAW Filter Technology Enables a Connected World," 20th International Conference on Solid-State Sensors, Actuators and Microsystems & Eurosensors XXXIII (Transducers & Eurosensors XXXIII), Jun. 23-27, 2019, Berlin, Germany, IEEE, pp. 523-526.

(56) References Cited

OTHER PUBLICATIONS

Kreuzer, S. et al., "Full band 41 filter with high Wi-Fi rejection—design and manufacturing challenges," IEEE International Ultrasonics Symposium (IUS), Oct. 21-24, 2015, Taipei, Taiwan, IEEE, 4 pages.

Volatier, A. et al., "Technology enhancements for high performance BAW duplexer," IEEE International Ultrasonics Symposium (IUS), Jul. 21-25, 2013, Prague, Czech Republic, IEEE, pp. 761-764.

Non-Final Office Action for U.S. Appl. No. 16/740,667, dated Mar. 4, 2021, 10 pages.

Non-Final Office Action for U.S. Patent Application No. 16/776,738, dated Mar. 4, 2021, 7 pages.

Non-Final Office Action for U.S. Appl. No. 16/806,166, dated Mar. 18, 2021, 6 pages.

Larson, John, et al., "Characterization of Reversed c-axis AlN Thin Films," IEEE International Ultrasonics Symposium, San Diego, California, 2010, pp. 1054-1059.

Non-Final Office Action for U.S. Appl. No. 16/358,823, dated Apr. 5, 2021, 12 pages.

Non-Final Office Action for U.S. Appl. No. 15/883,933, dated Mar. 29, 2021, 11 pages.

Moreira, M. et al., "Aluminum scandium nitride thin-film bulk acoustic resonators for wide band applications," Vacuum, vol. 86, Issue 1, Jul. 2011, Elsevier Ltd., 4 pages.

Extended European Search Report for European Patent Application No. 22150239.6, dated Jun. 9, 2022, 10 pages.

Notice of Allowance and Examiner-Initiated Interview Summary for U.S. Appl. No. 16/722,125, dated Jun. 24, 2022, 10 pages.

U.S. Appl. No. 16/740,667, filed Jan. 13, 2020.

U.S. Appl. No. 16/776,738, filed Jan. 30, 2020.

U.S. Appl. No. 17/141,678, filed Jan. 5, 2021.

U.S. Appl. No. 17/088,872, filed Nov. 4, 2020.

Office Action for Japanese Patent Application No. 2018181230, dated Sep. 14, 2022, 9 pages.

Non-Final Office Action for U.S. Appl. No. 17/088,872, dated Aug. 29, 2022, 8 pages.

Notice of Allowance for U.S. Appl. No. 17/088,872, dated Dec. 14, 2022, 7 pages.

\* cited by examiner

HYBRID BULK ACOUSTIC WAVE FILTER

FIELD OF THE DISCLOSURE

The present disclosure relates to filtering circuitry for radio frequency (RF) signals, and specifically the filtering circuitry for RF signals including bulk acoustic wave (BAW) resonators.

BACKGROUND

Acoustic wave devices are widely used in modern electronics. At a high level, acoustic wave devices include a piezoelectric material in contact with one or more electrodes. Piezoelectric materials acquire a charge when compressed, twisted, or distorted, and similarly compress, twist, or distort when a charge is applied to them. Accordingly, when an alternating electrical signal is applied to the one or more electrodes in contact with the piezoelectric material, a corresponding mechanical signal (i.e., an oscillation or vibration) is transduced therein. Based on the characteristics of the one or more electrodes on the piezoelectric material, the properties of the piezoelectric material, and other factors such as the shape of the acoustic wave device and other structures provided on the device, the mechanical signal transduced in the piezoelectric material exhibits a frequency dependence on the alternating electrical signal. Acoustic wave devices leverage this frequency dependence to provide one or more functions, such as filtering.

Exemplary acoustic wave devices include BAW resonators, which are increasingly used to form filters used in the transmission and reception of RF signals for communication. Due to the stringent demands placed on filters for modern RF communication systems such as the specifications for fifth generation (5G) wireless networks, acoustic wave devices for these applications must provide high quality factor and high bandwidth (which can be achieved by high electromechanical coupling).

SUMMARY

In one embodiment, RF filtering circuitry comprises a first node, a second node, and a series signal path between the first node and the second node. A number of acoustic resonators are coupled to the first node and the second node via the series signal path. A first one of the acoustic resonators is associated with a first quality factor and a first electromechanical coupling coefficient. A second one of the acoustic resonators is associated with a second quality factor and a second electromechanical coupling coefficient. The first quality factor is different from the second quality factor and the first electromechanical coupling coefficient is different from the second electromechanical coupling coefficient. By providing some of the acoustic resonators to meet a first set of performance criteria and other ones of the acoustic resonators to meet a second set of performance criteria, a better balance between performance parameters such as electromechanical coupling (and thus bandwidth) and quality factor may be achieved for the RF filtering circuitry.

Each one of the acoustic resonators may include a first electrode, a piezoelectric layer on the first electrode, and a second electrode on the piezoelectric layer such that the piezoelectric layer is between the first electrode and the second electrode.

The piezoelectric material of the first one of the acoustic resonators may be different from the piezoelectric material of the second one of the acoustic resonators. In particular, the first one of the acoustic resonators may include a piezoelectric layer comprising a first piezoelectric material and the second one of the acoustic resonators may include a piezoelectric layer comprising a second piezoelectric material.

In one embodiment, the first piezoelectric material comprises intrinsic aluminum nitride and the second piezoelectric material comprises aluminum nitride doped with scandium.

In another embodiment, the first piezoelectric material comprises aluminum nitride doped with scandium at a first doping concentration and the second piezoelectric material comprises aluminum nitride doped with scandium at a second doping concentration that is greater than the first doping concentration.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
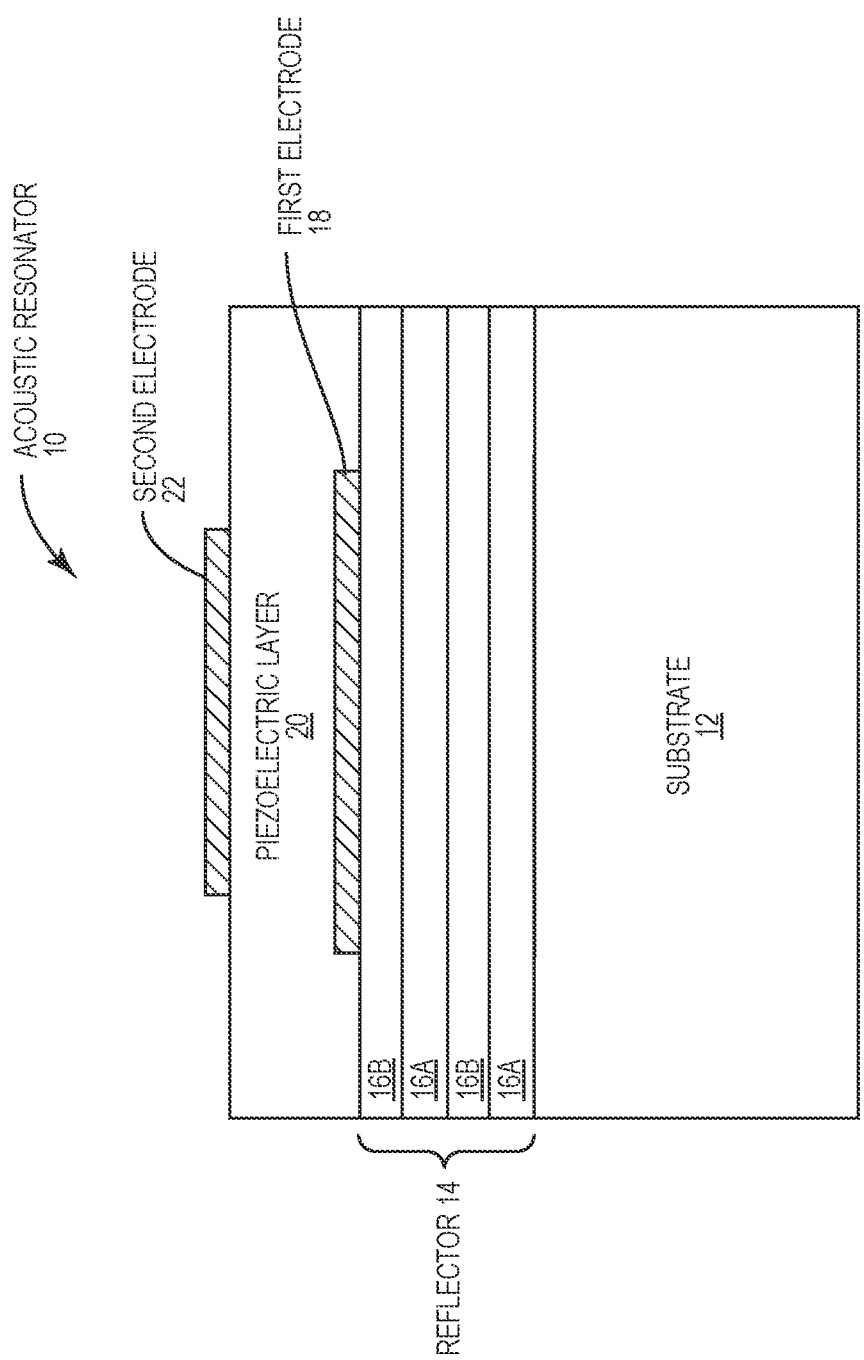
FIGS. 1A and 1B illustrate cross-sectional views of an acoustic resonator according to various embodiments of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1A illustrates an acoustic resonator 10 according to one embodiment of the present disclosure. The acoustic resonator 10 includes a substrate 12, a reflector 14 on the substrate, the reflector 14 including a number of reflector layers 16 that alternate in their material characteristics (illustrated as reflector layers 16A and 16B) to provide a Bragg reflector, a first electrode 18 on the reflector 14, a piezoelectric layer 20 on the first electrode 18, and a second electrode 22 on the piezoelectric layer 20 such that the piezoelectric layer 20 is between the first electrode 18 and the second electrode 22.

In one embodiment, the substrate 12 comprises silicon. The reflector 14 may comprise alternating layers of silicon oxide (e.g., layers 16A may comprise silicon oxide) and tungsten (e.g., layers 16B may comprise tungsten). The first electrode 18 and the second electrode 22 may comprise molybdenum. Notably, the materials named above for the substrate 12, the reflector 14, the first electrode 18, and the second electrode 22 are merely exemplary and those skilled in the art will readily appreciate that many different materials may be used for these layers without departing from the principles described herein.

The piezoelectric layer 20 may comprise aluminum nitride. As discussed above, in order to meet the high demands of modern wireless communications standards such as those proposed for 5G networks there is a desire for increased electromechanical coupling and thus bandwidth for the acoustic resonators that form RF filtering circuitry. To increase the electromechanical coupling of the acoustic resonator 10, the piezoelectric layer 20 may be provided as aluminum nitride doped with scandium. Providing the piezoelectric layer 20 as aluminum nitride doped with scandium increases the electromechanical coupling and thus bandwidth of the acoustic resonator 10. However, the increase in electromechanical coupling comes at the cost of reduced quality factor. The same modern wireless communications standards discussed above also require high quality factor, and thus it is difficult to provide RF filtering circuitry that meets both the electromechanical coupling (and thus bandwidth) and quality factor requirements.

Figure 1B:
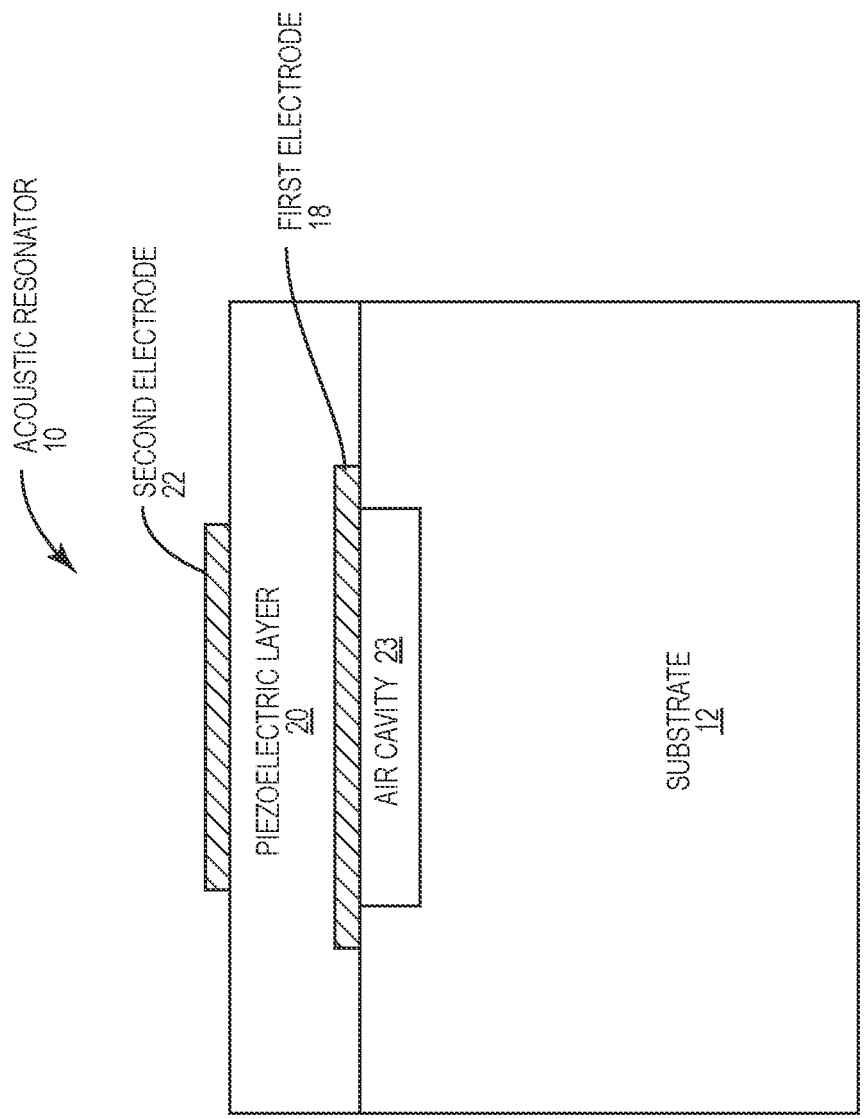

FIG. 1B illustrates the acoustic resonator 10 according to an additional embodiment of the present disclosure. The acoustic resonator 10 shown in FIG. 1B is largely the same as that discussed above with respect to FIG. 1A, except that the reflector 14 is removed and an air cavity 23 is provided below the first electrode 18 such that the acoustic resonator is a thin film bulk acoustic resonator rather than a solidly mounted resonator as shown in FIG. 1A. As will be readily appreciated by those skilled in the art, the principles of the present disclosure apply to any type of acoustic resonator.

Figure 2:
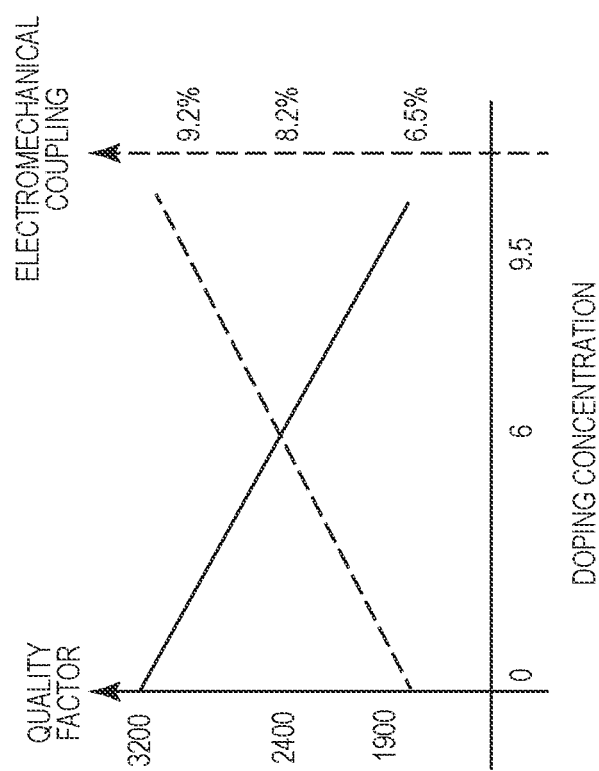
FIG. 2 is a graph illustrating a relationship between quality factor, electromechanical coupling, and doping concentration of a piezoelectric layer.

FIG. 2 is a graph illustrating a relationship between doping percentage of scandium in aluminum nitride for the piezoelectric layer 20, quality factor, and electromechanical coupling of the acoustic resonator 10. In particular, FIG. 2 shows a solid vertical axis and line illustrating quality factor, a dashed vertical axis and line illustrating electromechanical coupling, and a horizontal axis illustrating doping concentration. As illustrated, as the doping concentration of scandium increases from left to right, the quality factor decreases while the electromechanical coupling increases. As discussed above, it is desirable to have both high electromechanical coupling and high quality factor for an acoustic resonator used in modern RF filtering circuitry.

Figure 3:
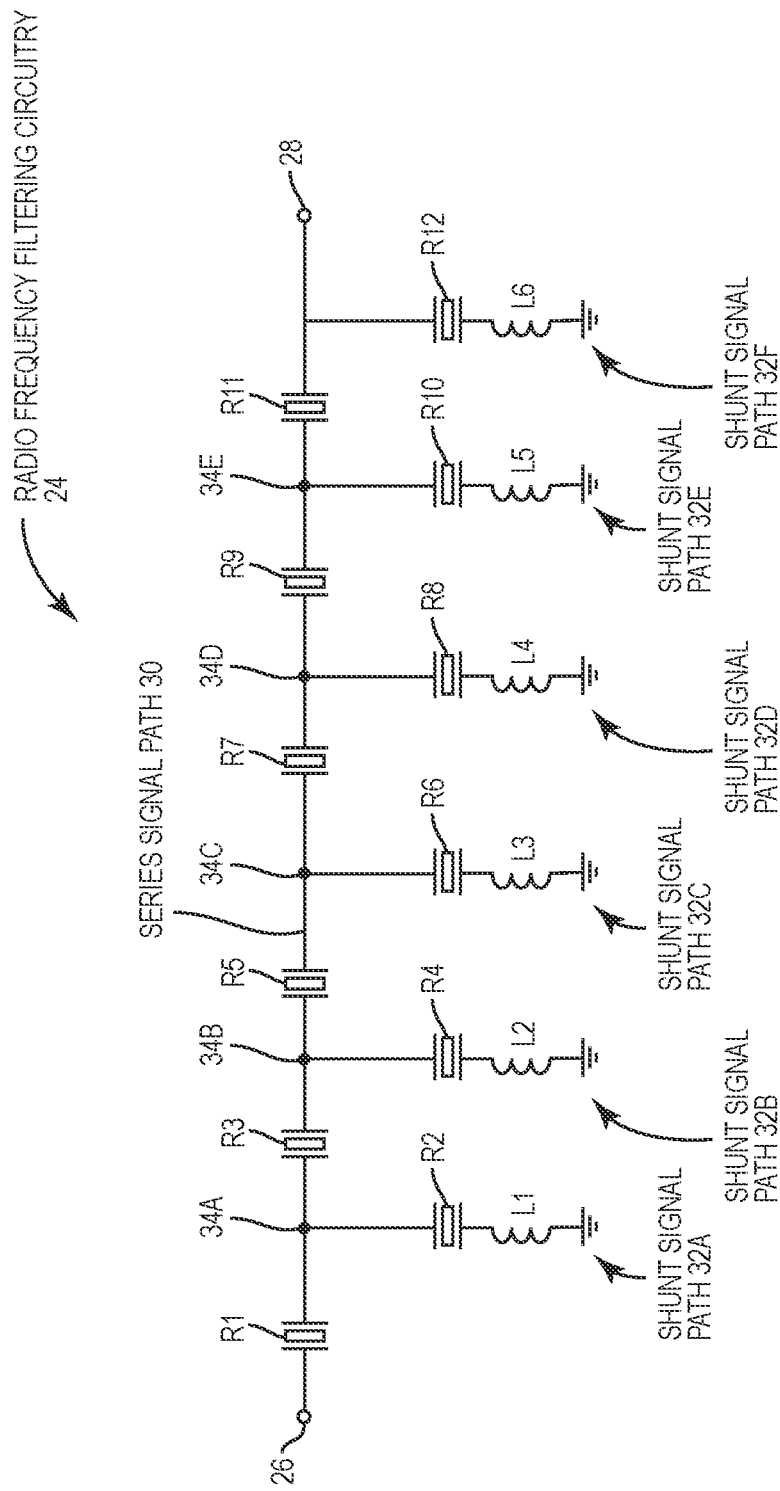
FIG. 3 is a schematic illustrating RF filtering circuitry according to one embodiment of the present disclosure.

FIG. 3 is a schematic illustrating RF filtering circuitry 24 according to one embodiment of the present disclosure. The RF filtering circuitry 24 includes a first node 26, a second node 28, a series signal path 30 between the first node 26 and the second node 28, and a number of shunt signal paths 32 between the series signal path 30 and a ground. A first acoustic resonator R1 is coupled between the first node 26 and a first intermediate node 34A. A second acoustic resonator R2 and a first inductor L1 are coupled in series between the first intermediate node 34A and ground to provide a first shunt signal path 32A. A third acoustic resonator R3 is coupled between the first intermediate node 34A and a second intermediate node 34B. A fourth acoustic resonator R4 and a second inductor L2 are coupled in series between the second intermediate node 34B and ground to provide a second shunt signal path 32B. A fifth acoustic resonator R5 is coupled between the second intermediate node 34B and a third intermediate node 34C. A sixth acoustic resonator R6 and a third inductor L3 are coupled between the third intermediate node 34C and ground to provide a third shunt signal path 32C. A seventh acoustic resonator R7 is coupled between the third intermediate node 34C and a fourth intermediate node 34D. An eighth acoustic resonator R8 and a fourth inductor L4 are coupled in series between the fourth intermediate node 34D and ground to provide a fourth shunt signal path 32D. A ninth acoustic resonator R9 is coupled between the fourth intermediate node 34D and a fifth intermediate node 34E. A tenth acoustic resonator R10 and a fifth inductor L5 are coupled in series between the fifth intermediate node 34E and ground to provide a fifth shunt signal path 32E. An eleventh acoustic resonator R11 is coupled between the fifth intermediate node 34E and the second node 28. A twelfth acoustic resonator R12, and a sixth inductor L6 are coupled in series between the second node 28 and ground to provide a sixth shunt signal path 32F.

Notably the RF filtering circuitry 24 shown in FIG. 3 is merely exemplary. Those skilled in the art will appreciate that the number of acoustic resonators and inductors as well as their placement between the first node 26, the second node 28, and ground will vary based on the particular specifications for the RF filtering circuitry 24. The concepts described in the present disclosure apply equally to all topologies of RF filtering circuitry, including ladder topologies, lattice topologies, transversal topologies, or any other type of topology.

Generally, the acoustic resonators (R1-R12) in the RF filtering circuitry 24 are uniform with respect to their performance characteristics such as electromechanical coupling (and thus bandwidth) and quality factor. This is because all of the acoustic resonators (R1-R12) utilize the same material for the piezoelectric layer 20 thereof. For example, all of the acoustic resonators (R1-R12) have a piezoelectric layer 20 that is one of intrinsic aluminum nitride or aluminum nitride doped with scandium. Due to the trade-off between quality factor and electromechanical coupling discussed above with respect to these materials, this results in sub-optimal performance of the RF filtering circuitry 24 either with respect to electromechanical coupling (and thus bandwidth) or quality factor.

To achieve a better trade-off between electromechanical coupling and quality factor, it is proposed herein to provide some of the acoustic resonators (R1-R12) having a first electromechanical coupling coefficient and a first quality factor and provide the remaining acoustic resonators (R1-R12) having a second electromechanical coupling coefficient and a second quality factor. The first electromechanical coupling coefficient is different from the second coupling coefficient, and the first quality factor is different from the second quality factor. In particular, the first electromechanical coupling coefficient may be less than the second electromechanical coupling coefficient and the first quality factor may be greater than the second quality factor. This approach wherein some of the acoustic resonators (R1-R12) are configured to meet a first set of performance criteria while the remaining ones of the acoustic resonators (R1-R12) are configured to meet a second set of performance criteria is referred to as a hybrid approach.

One way to achieve the hybrid approach is by providing the piezoelectric layer 20 of some of the acoustic resonators (R1-R12) comprising a first piezoelectric material (which provides the first quality factor and the first electromechanical coupling coefficient) and providing the piezoelectric layer 20 of the remaining ones of the acoustic resonators (R1-R12) comprising a second piezoelectric material (which provides the second quality factor and the second electromechanical coupling coefficient) that is different than the first piezoelectric material. In the exemplary RF filtering circuitry 24 described above, the second acoustic resonator R2 and the twelfth acoustic resonator R12 may have a piezoelectric layer 20 comprising a first piezoelectric material, while the remaining acoustic resonators (R1 and R3-R11) have a piezoelectric layer 20 comprising a second piezoelectric material. In one embodiment, the first piezoelectric material is intrinsic aluminum nitride and the second piezoelectric material is aluminum nitride doped with scandium. This configuration may also be reversed wherein the first piezoelectric material is aluminum nitride doped with scandium and the second piezoelectric material is intrinsic aluminum nitride. In another embodiment, the first piezoelectric material is aluminum nitride doped with scandium at a first concentration and the second piezoelectric material is aluminum nitride doped with scandium at a second doping concentration that is greater than the first doping concentration. In one embodiment, the second doping concentration is at least 1% greater than the first doping concentration. The present disclosure also contemplates embodiments in which the second doping concentration is more than 1% greater than the first doping concentration. In various embodiments, the second doping concentration may be at least 2% greater than the first doping concentration, at least 3% greater, at least 4% greater, at least 5% greater, etc. Notably, the present disclosure is not limited to aluminum nitride for the first piezoelectric material and the second piezoelectric material. In various embodiments, the first piezoelectric material and the second piezoelectric material may be any combination of lithium tantalate, zinc oxide, and lead zirconate titanate. Further, the present disclosure is not limited to scandium as a dopant. In various embodiments, the dopant may be any combination of gallium, yttrium, chromium, or co-doping of multiple elements such as magnesium and zirconium and magnesium and titanium. Those skilled in the art will appreciate that the above materials are merely exemplary and that the principles of the present disclosure apply to any piezoelectric materials and/or dopants.

Notably, while the example discussed above describes the second acoustic resonator R2 and the twelfth acoustic resonator R12 having a piezoelectric layer 20 comprising the first piezoelectric material and the remainder of the acoustic resonators (R1 and R3-R11) having a piezoelectric layer 20 comprising the second piezoelectric material, any ones of the acoustic resonators (R1-R12) may have a piezoelectric layer 20 comprising a different piezoelectric material than any other ones of the acoustic resonators (R1-R12). In some embodiments, the ones of the acoustic resonators (R1-R12) having a piezoelectric layer 20 comprising the first piezoelectric material are provided in one or more of the shunt signal paths 32. In other embodiments, the ones of the acoustic resonators (R1-R12) having a piezoelectric layer 20 comprising the first piezoelectric material are provided in the series signal path 30. In still other embodiments, the ones of the acoustic resonators (R1-R25) having a piezoelectric layer 20 comprising the first piezoelectric material are provided in both the series signal path 30 and one or more of the shunt signal paths 32. In general, those skilled in the art may use a piezoelectric layer 20 with a material providing higher electromechanical coupling in the acoustic resonators (R1-R12) responsible for providing the passband of the filter response of the RF filtering circuitry 24 while using a piezoelectric layer 20 with a material providing a higher quality factor in the acoustic resonators (R1-R12) responsible for providing the edges of the filter response of the RF filtering circuitry 24.

As discussed above, in a conventional design the acoustic resonators (R1-R12) of the RF filtering circuitry 24 would be provided having a uniform piezoelectric layer 20. Accordingly, the acoustic resonators (R1-R12) of the RF filtering circuitry 24 would generally be provided on a single acoustic die. In some embodiments, all of the acoustic resonators (R1-R12) in the RF filtering circuitry 24 are similarly provided on the same acoustic die. Such an approach may require more advanced die fabrication techniques due to differences in the material and/or doping of the piezoelectric layer 20 of the acoustic resonators (R1-R12). In other embodiments, in an effort to simplify the fabrication of the RF filtering circuitry 24, the acoustic resonators (R1-R12) may be provided on separate die based on the material used for the piezoelectric layer 20 thereof. For example, a first acoustic die may be used for the ones of the acoustic resonators (R1-R12) having a piezoelectric layer 20 comprising the first piezoelectric material while a second acoustic die may be used for the ones of the acoustic resonators (R1-R12) having a piezoelectric layer 20 comprising the second piezoelectric material.

While the above example contemplates a first subset of acoustic resonators having a piezoelectric layer 20 comprising a first piezoelectric material and a second subset of acoustic resonators having a piezoelectric layer 20 comprising a second piezoelectric material, the present disclosure also applies to RF filtering circuitry in which the acoustic resonators therein are divided into any number of subsets, each having a different piezoelectric material. For example, the present disclosure applies to RF filtering circuitry having a first subset of acoustic resonators wherein the piezoelectric layer 20 is intrinsic aluminum nitride, a second subset of acoustic resonators wherein the piezoelectric layer 20 thereof is aluminum nitride doped with scandium at a first doping concentration, and a third subset of acoustic resonators wherein the piezoelectric layer 20 thereof is aluminum nitride doped with scandium at a second doping concentration that is greater than the first doping concentration. Those skilled in the art will recognize that the present disclosure generally contemplates the use of different piezoelectric materials for different subsets of acoustic resonators in RF filtering circuitry in order to improve the performance thereof.

Figure 4B:
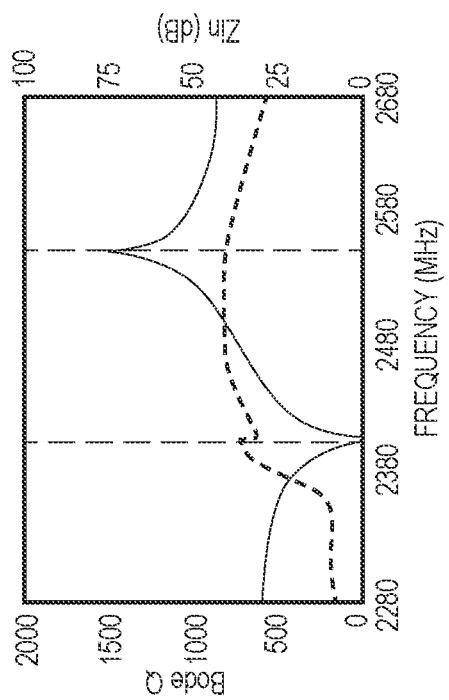
FIGS. 4A and 4B are graphs illustrating a relationship between quality factor, input impedance, and frequency for RF filtering circuitry according to various embodiments of the present disclosure.
Figure 4A:
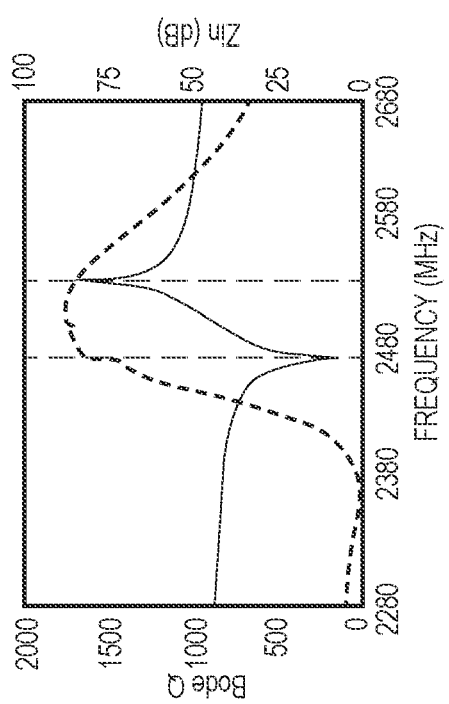

FIGS. 4A and 4B are graphs illustrating the input impedance and quality factor of an acoustic resonator having an intrinsically doped piezoelectric layer (e.g., aluminum nitride) and a doped piezoelectric layer (e.g., aluminum nitride doped with scandium), respectively. In particular, a solid line in the graphs shown in FIGS. 4A and 4B illustrates input impedance, while a dashed line illustrates a Bode plot of quality factor. As shown, the distance between the resonance and anti-resonance frequencies of the acoustic resonator with an intrinsically doped piezoelectric layer is relatively small when compared with the acoustic resonator having a doped piezoelectric layer. This indicates that the acoustic resonator having a doped piezoelectric layer has higher electromechanical coupling and bandwidth than the acoustic resonator having an intrinsic piezoelectric layer. The graphs also show a significantly higher quality factor for the acoustic resonator with the intrinsic piezoelectric layer, thus illustrating the tradeoff between electromechanical coupling (and thus bandwidth) and quality factor discussed above.

Figure 5A:
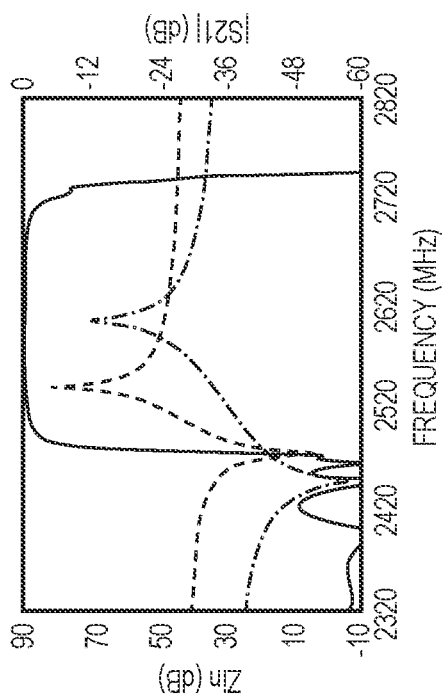
FIGS. 5A and 5B are graphs illustrating a relationship between input impedance, S21, and frequency for RF filtering circuitry according to various embodiments of the present disclosure.
Figure 5B:
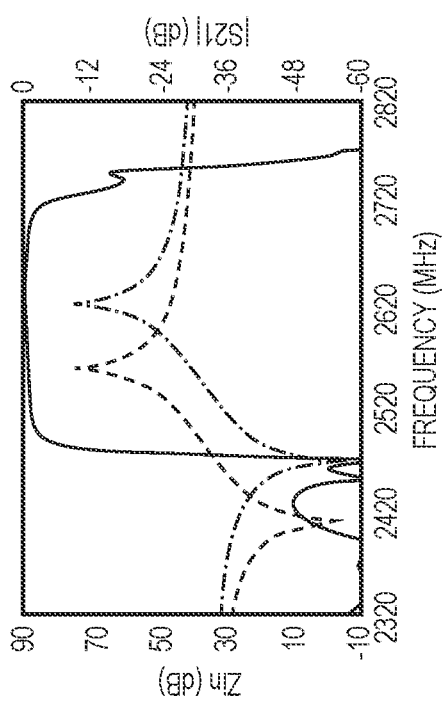

FIGS. 5A and 5B are graphs illustrating the input impedance and S parameter (|S21|) of a pair of acoustic resonators, where in FIG. 5A the pair of acoustic resonators both include a doped piezoelectric layer (e.g., aluminum nitride doped with scandium) and in FIG. 5B one of the pair of acoustic resonators includes an intrinsic piezoelectric layer while the other one of the acoustic resonators includes a doped piezoelectric layer (e.g., aluminum nitride). In FIGS. 5A and 5B, the solid line illustrates |S21|, the dashed line illustrates the input impedance of a first one of the pair of acoustic resonators, and the dotted and dashed line illustrates the input impedance of a second one of the pair of acoustic resonators (in FIG. 5B the first one of the pair of acoustic resonators includes an intrinsic piezoelectric layer while the second one of the pair of acoustic resonators includes a doped piezoelectric layer). Comparing FIG. 5A to FIG. 5B, FIG. 5B shows greater steepness and thus lower loss at the lower band edge.

Figure 6A:
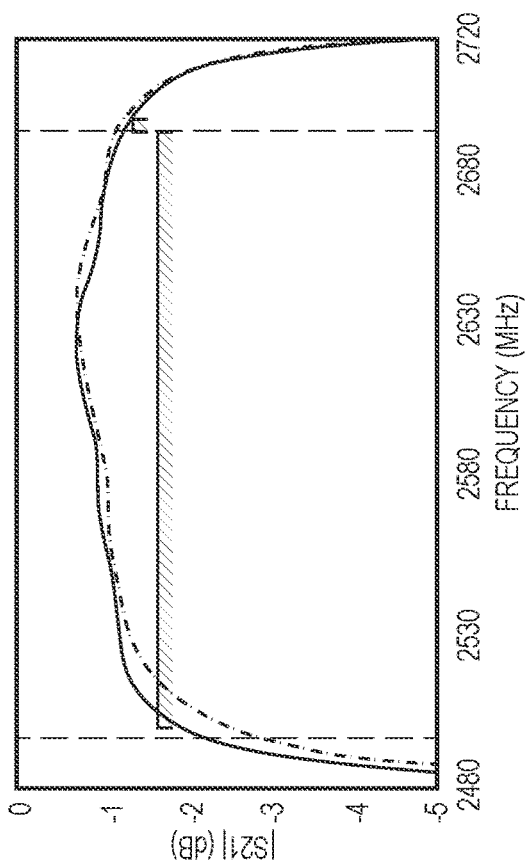
FIGS. 6A and 6B are graphs illustrating a filter response of RF filtering circuitry according to various embodiments of the present disclosure.

FIG. 6A is a graph illustrating the rejection of the RF filtering circuitry 24 around the Industrial, Scientific, and Medical (ISM) band. In FIG. 6A, the dashed line represents the performance of the RF filtering circuitry 24 if all of the acoustic resonators therein have a piezoelectric layer comprised of the same material (e.g., intrinsic aluminum nitride), and the solid line represents the performance of the RF filtering circuitry 24 wherein some of the acoustic resonators have a piezoelectric layer comprising a material that is different than the remaining acoustic resonators (e.g., intrinsic aluminum nitride and aluminum nitride doped with scandium) as discussed above. The hatched boxes in the graph illustrate a desired rejection for the ISM band. As illustrated, the steepness and thus rejection of the ISM band is improved when using a hybrid approach wherein some of the acoustic resonators have a piezoelectric layer that comprises a different material than the others in order to provide high electromechanical coupling in some of the acoustic resonators and high quality factor in other ones of the acoustic resonators.

Figure 6B:
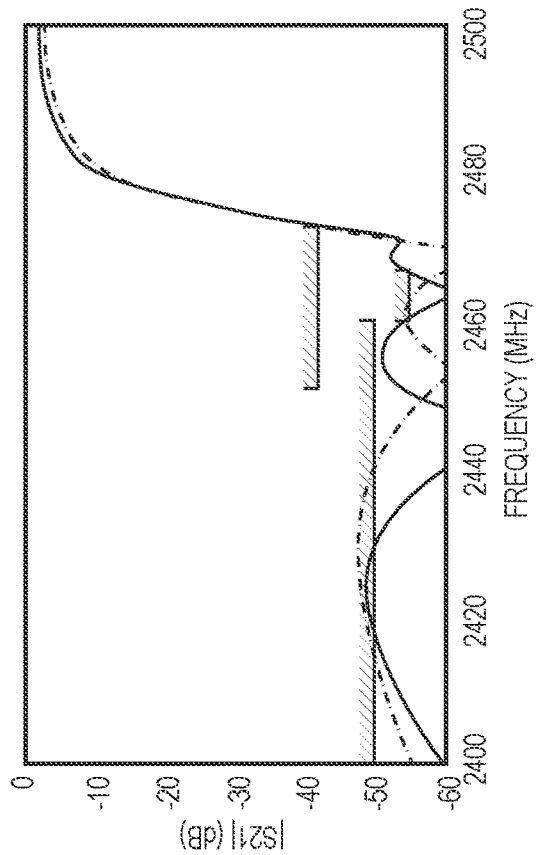

FIG. 6B is a graph illustrating the insertion loss of the RF filtering circuitry 24 within a band of interest. As in FIG. 6A, the dashed line represents the performance of the RF filtering circuitry 24 if all of the acoustic resonators therein have a piezoelectric layer comprised of the same material (e.g., intrinsic aluminum nitride), and the solid line represents the performance of the RF filtering circuitry 24 wherein some of the acoustic resonators have a piezoelectric material that is different than the remaining acoustic resonators (e.g., intrinsic aluminum nitride and aluminum nitride doped with scandium) as discussed above. The hatched boxes in the graph illustrate the band of interest. As illustrated, the hybrid approach wherein some of the acoustic resonators have a piezoelectric material that is different than the others results in higher bandwidth and thus less loss at the bottom end of the band of interest.

In short, the graphs in FIGS. 5A, 5B, 6A, and 6B illustrate that using a hybrid approach wherein a subset of the acoustic resonators has a piezoelectric layer with a different material than the rest of the acoustic resonators such as the one discussed above results in a better tradeoff between electromechanical coupling (and thus bandwidth) and quality factor than an approach in which all of the acoustic resonators in RF filtering circuitry have a uniform piezoelectric layer and thus the same relationship between electromechanical coupling, bandwidth, and quality factor.

Figure 7:
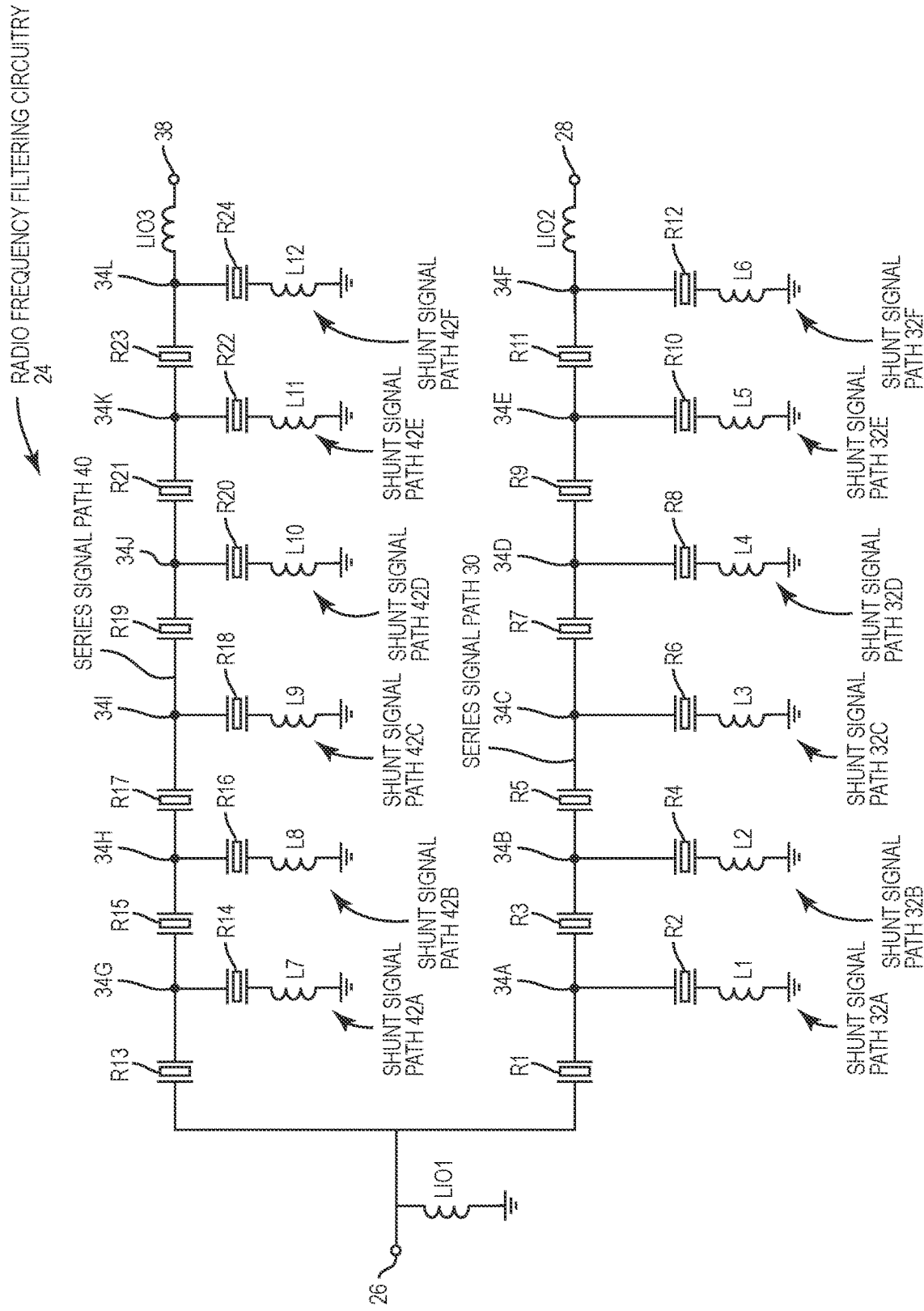
FIG. 7 is a schematic illustrating RF filtering circuitry according to one embodiment of the present disclosure.

As discussed above, the RF filtering circuitry 24 shown in FIG. 3 is merely exemplary. The principles of the present disclosure can be applied to any topology of RF filtering circuitry, including single band filters, diplexers, triplexers, and the like. FIG. 7 thus shows the RF filtering circuitry 24 configured as a diplexer. The RF filtering circuitry 24 includes the first node 26, the second node 28, the series signal path 30 between the first node 26 and the second node 28, and the number of shunt signal paths 32 between the series signal path 30 and a ground. The configuration of the series signal path 30 and the shunt signal paths 32 coupled thereto is similar to that shown in FIG. 2. In particular, a first input output inductor L101 is coupled between the first node 26 and ground. The first acoustic resonator R1 is coupled between the first node 26 and the first intermediate node 34A. The second acoustic resonator R2 and the first inductor L1 are coupled in series between the first intermediate node 34A and ground to provide the first shunt signal path 32A. The third acoustic resonator R3 is coupled between the first intermediate node 34A and the second intermediate node 34B. The fourth acoustic resonator R4 and the second inductor L2 are coupled in series between the second intermediate node 34B and ground to provide the second shunt signal path 32B. The fifth acoustic resonator R5 is coupled between the second intermediate node 34B and the third intermediate node 34C. The sixth acoustic resonator R6 and the third inductor L3 are coupled between the third intermediate node 34C and ground to provide the third shunt signal path 32C. The seventh acoustic resonator R7 is coupled between the third intermediate node 34C and the fourth intermediate node 34D. The eighth acoustic resonator R8 and the fourth inductor L4 are coupled in series between the fourth intermediate node 34D and ground to provide the fourth shunt signal path 32D. The ninth acoustic resonator R9 is coupled between the fourth intermediate node 34D and the fifth intermediate node 34E. The tenth acoustic resonator R10 and the fifth inductor L5 are coupled in series between the fifth intermediate node 34E and ground to provide the fifth shunt signal path 32E. The eleventh acoustic resonator R11 is coupled between the fifth intermediate node 34E and a sixth intermediate node 34F. The twelfth acoustic resonator R12 and the sixth inductor L6 are coupled in series between the sixth intermediate node 34F and ground to provide the sixth shunt signal path 32F. A second input output inductor L102 is coupled between the sixth intermediate node 34F and the second node 28.

The RF filtering circuitry 24 further includes a third node 38, an additional series signal path 40 coupled between the first node 26 and the third node 38, and a number of additional shunt signal paths 42 coupled between the additional series signal path 40 and a ground. A thirteenth acoustic resonator R13 is coupled between the first node 26 and a seventh intermediate node 34G. A fourteenth acoustic resonator R14 and a seventh inductor L7 are coupled in series between the seventh intermediate node 34G and ground to provide a first additional shunt signal path 42A. A fifteenth acoustic resonator R15 is coupled between the seventh intermediate node 34G and an eighth intermediate node 34H. A sixteenth acoustic resonator R16 and an eighth inductor L8 are coupled in series between the eighth intermediate node 34H and ground to provide a second additional shunt signal path 42B. A seventeenth acoustic resonator R17 is coupled between the eighth intermediate node 34H and a ninth intermediate node 34I. An eighteenth acoustic resonator R18 and a ninth inductor L9 are coupled in series between the ninth intermediate node 34I and ground to provide a third additional shunt signal path 42C. A nineteenth acoustic resonator R19 is coupled between the ninth intermediate node 34I and a tenth intermediate node 34J. A twentieth acoustic resonator R20 and a tenth inductor L10 are coupled in series between the tenth intermediate node 34J and ground to provide a fourth additional shunt signal path 42D. A twenty-first acoustic resonator R21 is coupled between the tenth intermediate node 34J and an eleventh intermediate node 34K. A twenty-second acoustic resonator R22 and an eleventh inductor L11 are coupled in series between the eleventh intermediate node 34K and ground to provide a fifth additional shunt signal path 42E. A twenty-third acoustic resonator R23 is coupled between the eleventh intermediate node 34K and a twelfth intermediate node 34L. A twenty-fourth acoustic resonator R24 is coupled in series with a twelfth inductor L12 between the twelfth intermediate node 34L and ground to provide a sixth additional shunt signal path 42F. A third input output inductor L103 is coupled between the twelfth intermediate node 34L and the third node 38.

Those skilled in the art will appreciate that the RF filtering circuitry 24 shown in FIG. 7 is merely exemplary. The number of acoustic resonators as well as their placement between the first node 26, the second node 28, the third node 38, and ground will vary based on the particular specifications for the RF filtering circuitry 24. The concepts described in the present disclosure apply equally to all topologies of RF filtering circuitry, including lattice and modified lattice topologies.

The RF filtering circuitry 24 shown in FIG. 7 may provide diplexer functionality such that signals within a first RF band are isolated and passed between the first node 26 and the second node 28 and RF signals within a second RF band are isolated and passed between the first node 26 and the third node 38. Using a hybrid approach as discussed above may involve providing the second acoustic resonator R2, the twelfth acoustic resonator R12, the thirteenth acoustic resonator R13, the fifteenth acoustic resonator R15, the twenty-first acoustic resonator R21, and the twenty-third acoustic resonator R23 with a piezoelectric layer 20 comprising a first piezoelectric material and providing the remaining ones of the acoustic resonators (R1, R3-R11, R14, R16-R20, R22, and R24) with a piezoelectric layer 20 comprising a second piezoelectric material that is different than the first piezoelectric material. In one embodiment, the first piezoelectric material is intrinsic aluminum nitride and the second piezoelectric material is aluminum nitride doped with scandium. In another embodiment, the first piezoelectric material is aluminum nitride doped with scandium at a first concentration and the second piezoelectric material is aluminum nitride doped with scandium at a second doping concentration that is greater than the first doping concentration. In one embodiment, the second doping concentration is 1% greater than the first doping concentration. The present disclosure also contemplates embodiments in which the second doping concentration is more than 1% greater than the first doping concentration. In various embodiments, the second doping concentration may be at least 2% greater than the first doping concentration, at least 3% greater, at least 4% greater, at least 5% greater, etc.

Notably, any ones of the acoustic resonators (R1-R24) may have a piezoelectric layer 20 comprising a different material than any other ones of the acoustic resonators (R1-R24). In general, those skilled in the art may use a piezoelectric layer 20 with a material providing higher electromechanical coupling in the acoustic resonators (R1-R24) responsible for providing the passband of the filter response while using a piezoelectric layer 20 with a material providing a higher quality factor in the acoustic resonators (R1-R24) responsible for providing the edges of the filter response of the RF filtering circuitry 24.

As discussed above, in a conventional design the acoustic resonators (R1-R24) of the RF filtering circuitry 24 would be provided having a piezoelectric layer 20 that is uniform. Accordingly, the acoustic resonators (R1-R24) of the RF filtering circuitry 24 would generally be provided on a single acoustic die. In some embodiments, all of the acoustic resonators (R1-R24) are similarly provided on the same acoustic die. Such an approach may require more advanced die fabrication techniques due to differences in the material and/or doping in the piezoelectric layer 20 of the acoustic resonators (R1-R24). In other embodiments, in an effort to simplify the fabrication of the RF filtering circuitry 24, the acoustic resonators (R1-R24) may be separated into separate die based on the material used for the piezoelectric layer 20 thereof. For example, a first acoustic die may be used for the ones of the acoustic resonators (R1-R24) having a piezoelectric layer 20 comprising the first piezoelectric material while a second acoustic die may be used for the ones of the acoustic resonators (R1-R24) having a piezoelectric layer 20 comprising the second piezoelectric material.

While the above example contemplates a first subset of acoustic resonators having a piezoelectric layer 20 comprising a first piezoelectric material and a second subset of acoustic resonators having a piezoelectric layer 20 comprising a second piezoelectric material, the present disclosure also applies to RF filtering circuitry in which the acoustic resonators therein are divided into any number of subsets, each having a different piezoelectric material. For example, the present disclosure applies to RF filtering circuitry having a first subset of acoustic resonators wherein the piezoelectric layer 20 is intrinsic aluminum nitride, a second subset of acoustic resonators wherein the piezoelectric layer 20 thereof is aluminum nitride doped with scandium at a first doping concentration, and a third subset of acoustic resonators wherein the piezoelectric layer 20 thereof is aluminum nitride doped with scandium at a second doping concentration that is greater than the first doping concentration. Those skilled in the art will recognize that the present disclosure generally contemplates the use of different piezoelectric materials for different subsets of acoustic resonators in RF filtering circuitry in order to improve the performance thereof.

Those skilled in the art will recognize improvements and modifications to the preferred embodiments of the present disclosure. All such improvements and modifications are considered within the scope of the concepts disclosed herein and the claims that follow.

What is claimed is:

1. Radio frequency filtering circuitry comprising:
a first node and a second node;
a series signal path between the first node and the second node; and
a plurality of acoustic resonators, each coupled to one or more of the first node and the second node via the series signal path, wherein:
 a first one of the plurality of acoustic resonators comprises a first piezoelectric layer that comprises an intrinsic piezoelectric material, and the first one of the plurality of acoustic resonators is associated with a first quality factor and a first electromechanical coupling coefficient; and
 a second one of the plurality of acoustic resonators comprises a second piezoelectric layer that comprises a doped piezoelectric material, and the second one of the plurality of acoustic resonators is associated with a second quality factor and a second electromechanical coupling coefficient such that the first quality factor is different from the second quality factor and the first electromechanical coupling coefficient is different from the second electromechanical coupling coefficient.

2. The radio frequency filtering circuitry of claim 1 further comprising one or more shunt signal paths coupled between the series signal path and a ground.

3. The radio frequency filtering circuitry of claim 2 wherein:
the first one of the plurality of acoustic resonators is coupled in the series signal path; and
the second one of the plurality of acoustic resonators is coupled in one of the one or more shunt signal paths.

4. The radio frequency filtering circuitry of claim 2 wherein:
the first one of the plurality of acoustic resonators is coupled in one of the one or more shunt signal paths; and
the second one of the plurality of acoustic resonators is coupled in the series signal path.

5. The radio frequency filtering circuitry of claim 1 wherein:
the first piezoelectric layer is arranged between a first electrode and a second electrode of the first one of the plurality of acoustic resonators; and
the second piezoelectric layer is arranged between a first electrode and a second electrode of the second one of the plurality of acoustic resonators.

6. The radio frequency filtering circuitry of claim 1 wherein the first one of the plurality of acoustic resonators and the second one of the plurality of acoustic resonators are provided on a same acoustic die.

7. The radio frequency filtering circuitry of claim 1 wherein acoustic resonators of the plurality of acoustic resonators are bulk acoustic wave resonators.

8. The radio frequency filtering circuitry of claim 1 wherein:
the first piezoelectric material is intrinsic aluminum nitride; and
the second piezoelectric material is aluminum nitride doped with scandium.

9. The radio frequency filtering circuitry of claim 1, further comprising a first acoustic die and a second acoustic die, wherein the first one of the plurality of acoustic resonators is provided on the first resonator die and the second one of the plurality of acoustic resonators is provided on the second resonator die.

10. Radio frequency filtering circuitry comprising:
a first node and a second node;
a series signal path between the first node and the second node; and
a plurality of acoustic resonators, each coupled to one or more of the first node and the second node via the series signal path, wherein:
 a first one of the plurality of acoustic resonators comprises a first piezoelectric layer that comprises a piezoelectric material including a dopant at a first doping concentration, and the first one of the plurality of acoustic resonators is associated with a first quality factor and a first electromechanical coupling coefficient; and
 a second one of the plurality of acoustic resonators comprises a second piezoelectric layer that comprises the piezoelectric material including a dopant at a second doping concentration that is greater than the first doping concentration, the second one of the plurality of acoustic resonators is associated with a second quality factor and a second electromechanical coupling coefficient, and the second electromechanical coupling coefficient is different from the first electromechanical coupling coefficient.

11. The radio frequency filtering circuitry of claim 10 further comprising one or more shunt signal paths coupled between the series signal path and a ground.

12. The radio frequency filtering circuitry of claim 11 wherein:
the first one of the plurality of acoustic resonators is coupled in the series signal path; and
the second one of the plurality of acoustic resonators is coupled in one of the one or more shunt signal paths.

13. The radio frequency filtering circuitry of claim 11 wherein:
the first one of the plurality of acoustic resonators is coupled in one of the one or more shunt signal paths; and
the second one of the plurality of acoustic resonators is coupled in the series signal path.

14. The radio frequency filtering circuitry of claim 10 wherein the piezoelectric material is aluminum nitride and the dopant is scandium.

15. The radio frequency filtering circuitry of claim 10 wherein:
the first piezoelectric layer is arranged between a first electrode and a second electrode of the first one of the plurality of acoustic resonators; and
the second piezoelectric layer is arranged between a first electrode and a second electrode of the second one of the plurality of acoustic resonators.

16. The radio frequency filtering circuitry of claim 10 wherein acoustic resonators of the plurality of acoustic resonators are bulk acoustic wave resonators.

17. The radio frequency filtering circuitry of claim 10 wherein the piezoelectric material of the first piezoelectric layer and the second piezoelectric layer comprises aluminum nitride doped with scandium.

18. The radio frequency filtering circuitry of claim 10 further comprising a first acoustic die and a second acoustic die, wherein the first one of the plurality of acoustic resonators is provided on the first resonator die and the second one of the plurality of acoustic resonators is provided on the second resonator die.

19. The radio frequency filtering circuitry of claim 10 wherein the first one of the plurality of acoustic resonators and the second one of the plurality of acoustic resonators are provided on a same acoustic die.

20. The radio frequency filtering circuitry of claim 10 wherein the second doping concentration is 1% greater than the first doping concentration.

* * * * *

UNITED STATES PATENT AND TRADEMARK OFFICE
CERTIFICATE OF CORRECTION

| | |
|---|---|
| PATENT NO. | : 11,575,363 B2 |
| APPLICATION NO. | : 17/152110 |
| DATED | : February 7, 2023 |
| INVENTOR(S) | : Alfred Gimenez et al. |

It is certified that error appears in the above-identified patent and that said Letters Patent is hereby corrected as shown below:

In the Specification

Column 9, Lines 9-10, replace "a first input output inductor L101" with --a first input output inductor LIO1--.
Column 9, Lines 41-42, replace "A second input output inductor L102" with --A second input output inductor LIO2--.
Column 10, Line 14, replace "A third input output inductor L103" with --A third input output inductor LIO3--.

Signed and Sealed this
Fourteenth Day of March, 2023

Katherine Kelly Vidal
*Director of the United States Patent and Trademark Office*